United States Patent
Zhang et al.

(10) Patent No.: US 9,887,703 B1
(45) Date of Patent: Feb. 6, 2018

(54) AREA EFFICIENT DIGITAL TO ANALOG AND ANALOG TO DIGITAL CONVERTERS

(71) Applicant: Texas Instruments Incorporated, Dallas, TX (US)

(72) Inventors: Jun Zhang, Shanghai (CN); Xuan Wang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/600,462

(22) Filed: May 19, 2017

Related U.S. Application Data

(63) Continuation of application No. PCT/CN2017/070373, filed on Jan. 6, 2017.

(51) Int. Cl.
*H03M 1/10* (2006.01)
*H03M 1/12* (2006.01)
*H03M 1/80* (2006.01)
*H03M 1/00* (2006.01)

(52) U.S. Cl.
CPC ............ *H03M 1/1009* (2013.01); *H03M 1/00* (2013.01); *H03M 1/12* (2013.01); *H03M 1/804* (2013.01)

(58) Field of Classification Search
CPC ........... H03M 1/12; H03M 1/00; H03M 1/804
USPC ................ 341/120, 150, 153, 155, 172, 156
See application file for complete search history.

(56) References Cited

U.S. PATENT DOCUMENTS 6,297,759 B1 * 10/2001 Lewyn ................. H03M 1/662
341/150

* cited by examiner

*Primary Examiner* — Joseph Lauture
(74) *Attorney, Agent, or Firm* — Gregory J. Albin; Charles A. Brill; Frank D. Cimino

(57) ABSTRACT

A digital-to-analog converter (DAC) for converting an M bit digital value to an analog signal includes a capacitive DAC and a resistive DAC. The capacitive DAC is configured to convert N most significant bits of the digital value to an analog signal. The resistive DAC is configured to covert M-N least significant bits (LSBs) of the digital value to an analog signal. The resistive DAC includes a coarse DAC and a fine DAC. The coarse DAC is configured to convert a most significant R bits of the M-N least significant bits to an analog signal. An output of the coarse DAC is switchably coupled to a first capacitor of the capacitive DAC. The fine DAC is configured to convert M-N-R least significant bits of the M-N least significant bits to an analog signal. An output of the fine DAC is switchably coupled to a second capacitor of the capacitive DAC.

20 Claims, 9 Drawing Sheets

AREA EFFICIENT DIGITAL TO ANALOG AND ANALOG TO DIGITAL CONVERTERS

BACKGROUND

An analog to digital converter (ADC) is an electronic device that converts a continuous signal (i.e., an analog signal) into a discrete time (digital) representation. Analog to digital converters may convert input analog voltages or currents into digital values. The digital values may be proportional to the magnitude of the voltage level of the input analog signal. The resolution of the converter indicates the number of discrete values it can produce over the range of analog values. When the values are stored electronically in a binary form, the resolution is expressed in bits.

A successive approximation type ADC samples an analog voltage input, and applies a binary search to converge on a digital value that best represents the analog voltage input. In a successive approximation ADC, control circuitry provides an approximation value to a digital to analog converter (DAC). The DAC generates an analog voltage from the approximation value, and a comparator compares the sampled and held analog voltage input with the voltage generated by the DAC. The control circuitry successively determines the value of each bit of a digital output value based on the compared voltages.

SUMMARY

A successive approximation analog to digital converter (ADC) and a digital to analog converter (DAC) for use in the ADC are disclosed herein. In one embodiment, an analog to digital converter (ADC) includes successive approximation circuitry and a digital to analog converter (DAC). The successive approximation circuitry is configured to perform a binary search for a digital value best representing an analog input signal. The DAC is coupled to the successive approximation logic. The DAC is configured to convert an M bit digital value to an analog signal. The DAC includes a capacitive DAC and a resistive DAC. The capacitive DAC is configured to convert N most significant bits (MSBs) of the digital value to an analog signal. The resistive DAC is configured to covert M-N least significant bits (LSBs) of the digital value to an analog signal. The resistive DAC includes a coarse DAC and a fine DAC. The coarse DAC is configured to convert a most significant R bits of the M-N LSBs to an analog signal. The fine DAC is configured to convert M-N-R LSBs of the M-N least significant bits to an analog signal.

In another embodiment, a DAC for converting an M bit digital value to an analog signal includes a capacitive DAC and a resistive DAC. The capacitive DAC is configured to convert N MSBs of the digital value to an analog signal. The resistive DAC is configured to covert M-N LSBs of the digital value to an analog signal. The resistive DAC includes a coarse DAC and a fine DAC. The coarse DAC is configured to convert a most significant R bits of the M-N LSBs to an analog signal. An output of the coarse DAC is switchably coupled to a first capacitor of the capacitive DAC. The fine DAC is configured to convert M-N-R LSBs of the M-N LSBs to an analog signal. An output of the fine DAC is switchably coupled to a second capacitor of the capacitive DAC.

In a further embodiment, a DAC for converting an M bit digital value to an analog signal includes a capacitive DAC and a resistive DAC. The capacitive DAC is configured to convert N MSBs of the digital value to an analog signal. The resistive DAC is configured to covert M-N LSBs of the digital value to an analog signal. The resistive DAC includes a coarse DAC and a fine DAC. The coarse DAC is configured to convert a most significant R bits of the M-N LSBs to an analog signal. The coarse DAC includes $2^R-1$ sequentially connected unit resistors and $2^R$ switches. Each of the switches is connected to a different voltage of the coarse DAC. An output of the coarse DAC is switchably coupled to a first capacitor of the capacitive DAC. The fine DAC is configured to convert M-N-R LSBs of the M-N least significant bits to an analog signal. The fine DAC includes $2^{(M-N-R)}$ sequentially connected unit resistors and $2^{(M-N-R)}$ switches. Each of the switches of the fine DAC is connected to a terminal of one of the unit resistors of the fine DAC. An output of the fine DAC is switchably coupled to a second capacitor of the capacitive DAC. Resistance of the fine DAC is equivalent to a unit resistor.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

Analog-to-digital converters (ADCs) and digital-to-analog converters (DACs) are often incorporated as subsystems of a larger integrated circuit. For example, a microcontroller integrated circuit may include a DAC or an ADC. The circuit area of the ADC or DAC is one factor affecting the overall cost of the integrated circuit. Consequently, reduction of ADC or DAC circuit area can result in reduced integrated circuit cost.

Embodiments of the DAC and ADC disclosed herein include a hybrid capacitive resistive DAC that includes both a capacitive DAC and a resistive DAC. The resistive DAC includes a coarse resistive DAC and a fine resistive DAC implemented with substantially fewer resistors than in a conventional hybrid DAC. For example, in a conventional hybrid capacitive resistive DAC, a seven bit resistive DAC may include 128 unit resistors and 128 switches. In contrast, a seven bit resistive DAC in accordance with embodiments of the present disclosure may include only 31 unit resistors and 24 switches. Thus, the resistor ladder DAC disclosed herein includes fewer resistors, fewer switches, occupies less circuit area, and consumes less power than conventional resistor ladder DACs. Embodiments of the resistive DAC disclosed herein also provide constant impedance and current loading which reduces reference buffer design complexity, and reduces the noise introduced by DAC impedance and current load switching relative to conventional R-2R DACs.

Figure 1:
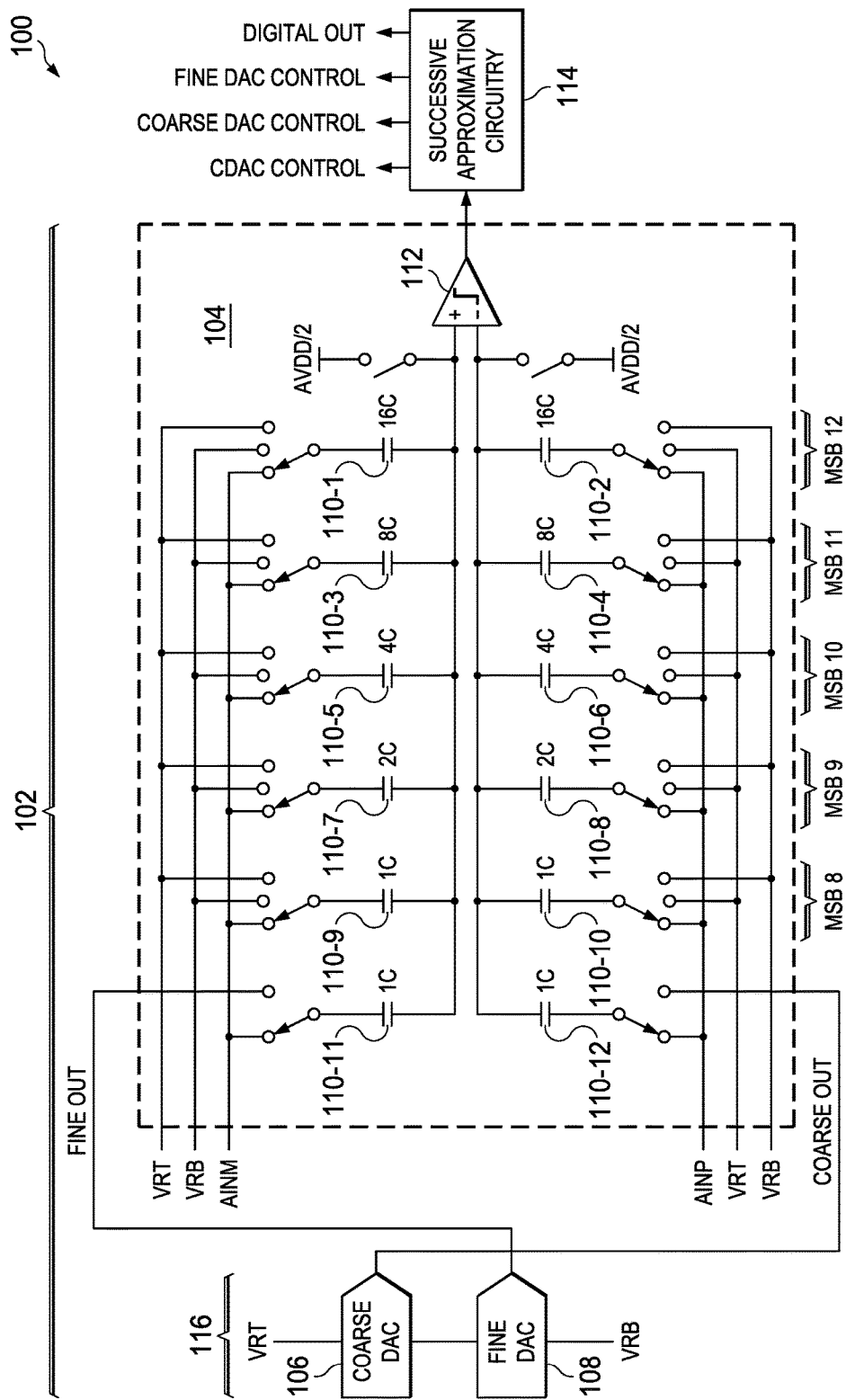
FIG. 1 shows a schematic diagram of a successive approximation analog to digital converter (ADC) that includes a digital to analog converter (DAC) in accordance with various examples.

FIG. 1 shows a schematic diagram of a successive approximation ADC 100 in accordance with various examples. The ADC 100 includes a hybrid capacitive resistive DAC 102 and successive approximation circuitry 114. The DAC 102 includes a capacitive DAC 104, and a resistive DAC 116 that includes a coarse resistive DAC 106 and a fine resistive DAC 108. The capacitive DAC 104 includes capacitors 110, illustrated in FIG. 1 as capacitors 110-1 to 110-12. The capacitive DAC 104 is illustrated as a five bit DAC. In some embodiments, the capacitive DAC 104 may convert a different number of bits, and include a different number of capacitors 110. The capacitors 110 are coupled to the comparator 112 and to a plurality of switches that switchably connect the capacitors 110 to an input signal, a reference signal, or an output of the resistive DAC 116.

The successive approximation circuitry 114 applies the output of the comparator 112 to perform a binary search for a value that the DAC 102 converts to an analog signal closest in amplitude to an analog input signal (e.g., AINP/M). The successive approximation circuitry 114 generates signals that control the operation of the capacitive DAC 104, the coarse resistive DAC 106 and the fine resistive DAC 108. For example, the successive approximation circuitry 114 may provide signals that switch the capacitors 110 between the analog input, reference voltages and resistive DAC outputs to test the voltages associated with each bit of the capacitive DAC 104. The successive approximation circuitry 114 may provide signals representative of bits of the digital value having significance lower than that of the bits provided to the capacitive DAC 104 to the resistive DAC 116. Of the signals provided to the resistive DAC 116, a selected number of signals representative of bits of higher significance may be provided to the coarse resistive DAC 104, and signals representative of bits of lower significance may be provided to the fine resistive DAC 108. For example, in an embodiment of the DAC 102 that converts a 12 bit digital value to an analog signal, the capacitive DAC 104 may convert the five most significant bits (e.g., bits 11-7) of the digital value to an analog signal, the coarse resistive DAC 106 convert a next four bits (e.g., bits 6-3) to an analog signal, and fine resistive DAC 108 may convert the three bits of lowest significance (e.g., bits 2-0) to an analog signal. Embodiments of the DAC 102 may convert various numbers of digital bits to an analog signal and each of the capacitive DAC 104, the coarse DAC 106, and the fine DAC 108 may convert various numbers of bits to an analog signal in different embodiments of the DAC 102.

Figure 2:
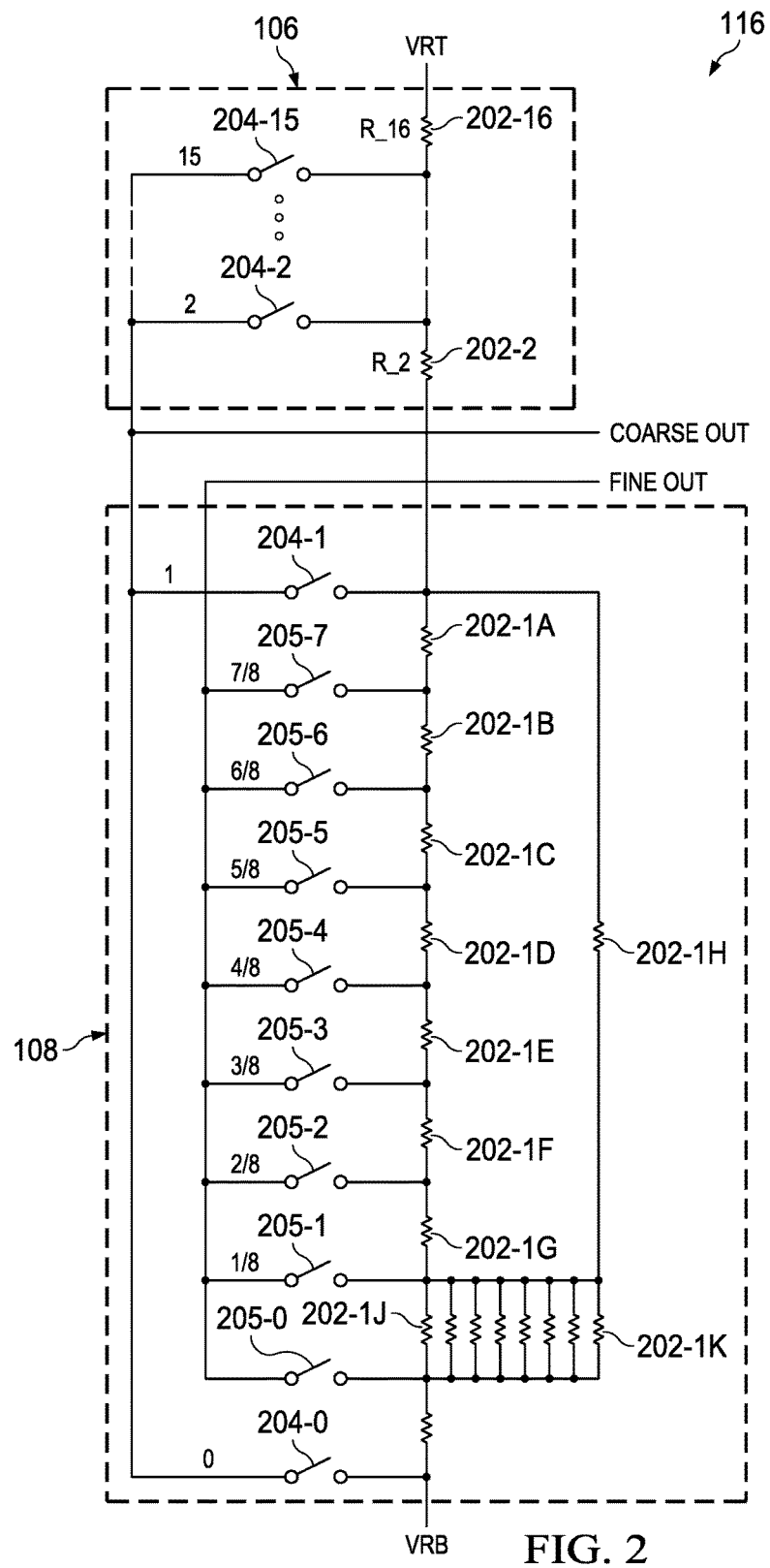
FIG. 2 shows a schematic diagram of a resistive DAC suitable for use in a successive approximation ADC in accordance with various examples.

FIG. 2 shows a schematic diagram of a resistive DAC 116 suitable for use in the successive approximation ADC 100 in accordance with various examples. The resistive DAC 116 includes the coarse DAC 106 and the fine DAC 108. The coarse DAC 106 includes a plurality of unit resistors 202 (illustrated as unit resistors 202-X) connected in series. For example, the coarse DAC 106 is illustrated in FIG. 2 as a four bit DAC and includes 15 unit resistors 202-2 to 202-16 connected in series. The coarse DAC 106 also includes a plurality of switches 204-0 to 204-15 (collectively switches 204). Each of the switches 204-1 to 204-15 is connected to a terminal of one of the unit resistors 202. Switch 204-0 is connected to a bottom reference voltage source, VRB (e.g., ground). The successive approximation circuitry 114 controls the opening and closing of switches 204 to produce a voltage output of the coarse DAC 106 for each four bit digital value. The unit resistor 202-15 is connected to a top reference voltage source (e.g., VRT). Thus, a four bit embodiment of the coarse DAC 106 includes 15 unit resistors 202 and 16 switches 204. The coarse DAC 106 may also include demultiplexing circuitry to selectively close one of the switches 204 corresponding to each different four bit digital value.

The fine DAC 108 is connected at one end to the coarse DAC 106 and at the opposite end to the bottom reference voltage source. The fine DAC 108 includes unit resistors 202 arranged to provide resistance equivalent to one unit resistor 202. In FIG. 2, the illustrated embodiment of the fine DAC 108 is a three bit DAC. The fine DAC 108 includes a first plurality of unit resistors (202-1A, 202-1B, 202-1C, 202-1D, 202-1E, 202-1F, 202-1G) connected in series, and a single unit resistor 202-1H connected in parallel with the first plurality of unit resistors 202. A second plurality of unit resistors (202-1J to 202-1K) are connected in parallel with one another, and connected in series with the combined resistance formed by unit resistors 202-1A-202-1H. The second plurality of unit resistors 202 are connected to the bottom reference voltage source. The number of resistors in the second plurality may be one more than the number of resistors in the first plurality. The fine DAC 108 also includes a plurality of switches 205 (205-0 to 205-7). Each of the switches 205-1 to 205-7 is connected to a junction of two of the unit resistors 202. The switch 205-0 is connected to the bottom reference voltage. Thus, a three bit embodiment of the fine DAC 108 includes 16 unit resistors 202 and eight switches 205. The fine DAC 108 may also include demultiplexing circuitry to selectively close one of the switches 205 corresponding to each different three bit digital value.

Thus, the seven bit resistive DAC 116 of FIG. 2 includes 31 resistors and 24 switches. In contrast, a conventional seven bit resistive DAC may include 128 resistors and 128 switches.

Figure 3A:
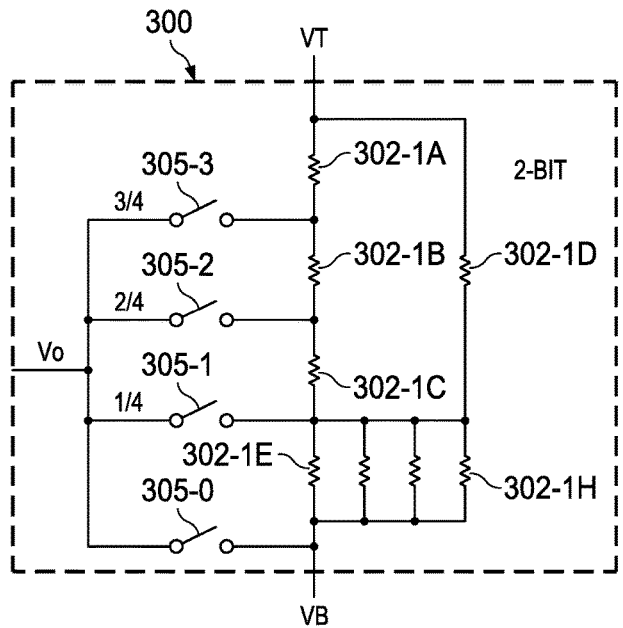
FIGS. 3A and 3B show examples of a fine DAC suitable for use in a successive approximation ADC in accordance with various examples.
Figure 3B:
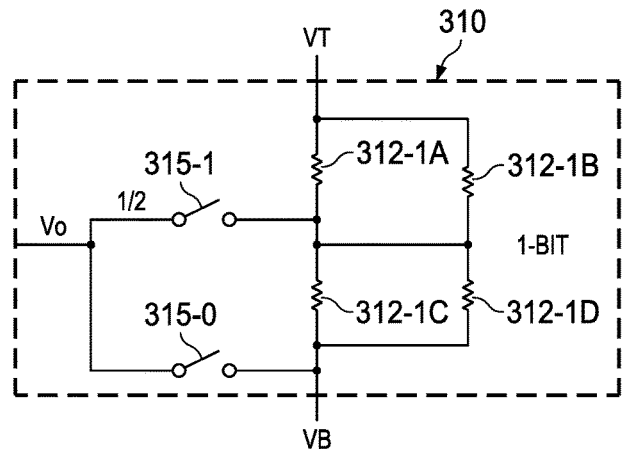

FIGS. 3A and 3B show additional examples of a fine resistive DAC suitable for use in a successive approximation ADC in accordance with various examples. FIG. 3A shows a two bit fine DAC 300. The fine DAC 300 is similar to the fine DAC 108, but includes fewer resistors and switches to accommodate conversion of a smaller digital value. The fine DAC 300 includes a first plurality of unit resistors (302-1A, 302-1B, 302-1C) connected in series, and single unit resistor 302-1D connected in parallel with the first plurality of unit resistors 302. A second plurality of unit resistors (302-1E to 302-1H) are connected in parallel with one another, and connected in series with the combined resistance formed by unit resistors 302-1A to 302-1D. The second plurality of unit resistors 302 are connected to the bottom reference voltage source. The fine DAC 300 also includes a plurality of switches (305-0 to 305-3). Each of the switches 305-1 to 305-3 is connected to a junction of two of the unit resistors 302. The switch 305-0 is connected to the bottom reference voltage. Thus, a two bit embodiment of the fine DAC 300 includes eight unit resistors 302 and four switches 305.

FIG. 3B shows a one bit fine DAC 310. The fine DAC 310 is similar to the fine DAC 300, but includes fewer resistors and switches to accommodate conversion of a single bit digital value. The fine DAC 310 includes a first unit resistor 312-1A connected in parallel with a second unit resistor 312-1B. A third and fourth unit resistors (312-1C and 312-1D) are connected in parallel with one another, and connected in series with the combined resistance formed by unit resistors 312-1A and 312-1B. The third and fourth unit resistors (312-1C and 312-1D) are connected to the bottom reference voltage source. The fine DAC 310 also includes a plurality of switches (315-0 and 315-1). Switch 315-1 is connected to a junction of two of the unit resistors 312-1A, 312-1C. The switch 315-0 is connected to the bottom reference voltage. Thus, a one bit embodiment of the fine DAC 310 includes four unit resistors 312 and two switches 315.

Figure 4:
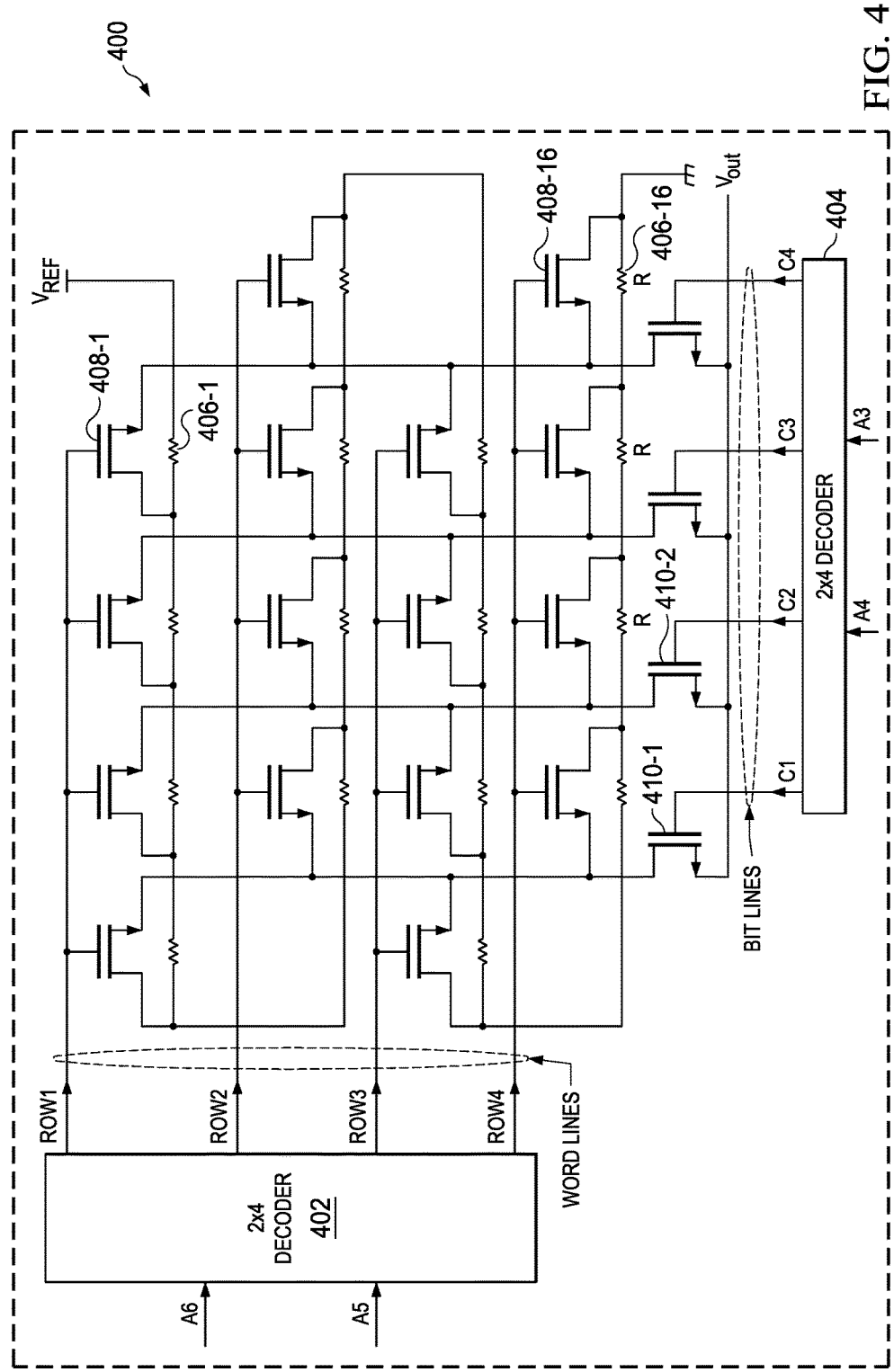
FIG. 4 shows a schematic diagram of a resistive DAC suitable for use in a successive approximation ADC in accordance with various examples.

FIG. 4 shows a schematic diagram of a resistive DAC 400 suitable for use in a successive approximation ADC in accordance with various examples. The resistive DAC 400 includes a plurality of unit resistors 406 connected in series, and arranged as a two dimensional array. The DAC 400 is generally configured as a four bit coarse DAC where a first two bit decoder 402 selects rows of the unit resistor array based on two bits of a four bit digital value, and a second two bit decoder 404 selects columns of the unit resistor array based on another two bits of the four bit digital value. The unit resistor 406-16 and switch 408-16 may be implemented as an embodiment of a fine resistive DAC as disclosed herein. For example, the unit resistor 406-16 and switch 408-16 may be implemented as an embodiment of a fine resistive DAC 108. Table 1 defines some output voltages of the seven bit resistive DAC 400:

TABLE 1

| Input Bits | | | | | | | |
|---|---|---|---|---|---|---|---|
| A6 | A5 | A4 | A3 | A2 | A1 | A0 | $V_{OUT}$ |
| 1 | 1 | 1 | 1 | 1 | 1 | 1 | $127 * V_{REF}/128$ |
| 1 | 1 | 1 | 1 | 0 | 0 | 0 | $120 * V_{REF}/128$ |
| 1 | 0 | 0 | 0 | 0 | 0 | 0 | $56 * V_{REF}/128$ |
| 0 | 0 | 0 | 0 | 0 | 0 | 0 | $8 * V_{REF}/128$ |
| 0 | 0 | 0 | 0 | 1 | 1 | 1 | $7 * V_{REF}/128$ |
| 0 | 0 | 0 | 0 | 0 | 0 | 0 | 0 |

Figure 5:
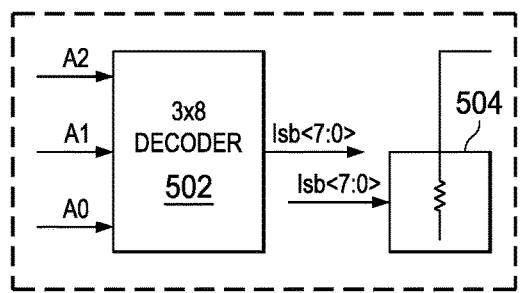
FIG. 5 shows a block diagram of a fine DAC with decoding circuitry in accordance with various examples.

FIG. 5 shows a schematic diagram of a fine resistive DAC with decoding circuitry suitable for use in the resistive DAC 400 in accordance with various examples. The resistor array 504 may be arranged as shown in the fine DAC 108 of FIG. 2. The three bit decoder 502 decodes a three bit digital value to select one of the eight switches of the fine DAC 108, thereby selecting the output voltage of the fine DAC.

Figure 6:
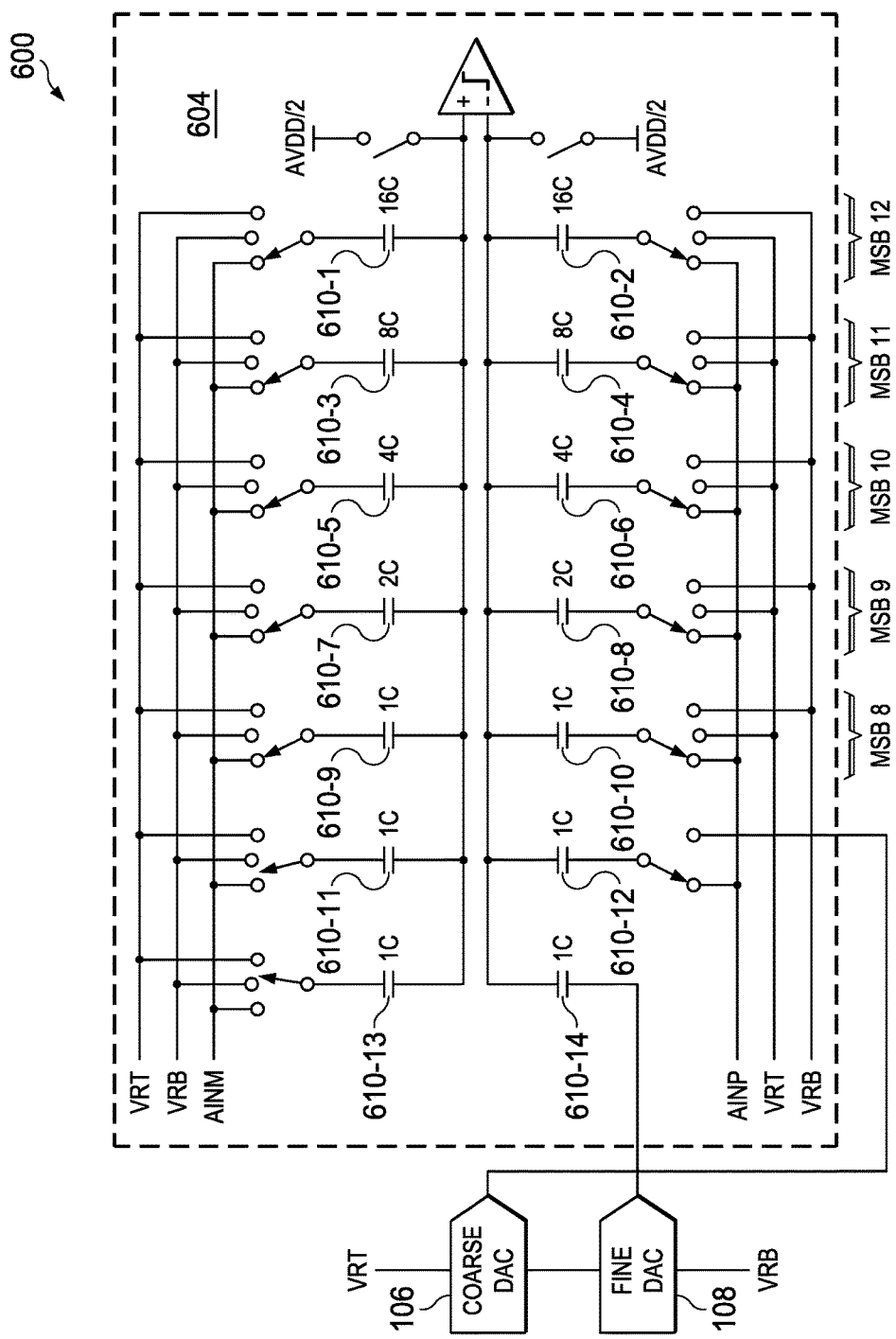
FIG. 6 shows a schematic diagram of a DAC suitable for use in a successive approximation ADC in accordance with various examples.

FIG. 6 shows a schematic diagram for an embodiment of a twelve bit DAC 600 suitable for use in a successive approximation ADC in accordance with various examples. The DAC 600 is similar to the DAC 102, but includes an additional pair of capacitors 610-13 and 610-14 in the capacitive DAC 604. The connection of the coarse resistive DAC 106 to the capacitive DAC 604 is similar to that in the capacitive DAC 104. In the capacitive DAC 604, the fine resistive DAC 108 is connected to the capacitor 610-14. In some embodiments of the DAC 600, the coarse resistive DAC 400 (as shown in FIG. 4) may be employed in place of the coarse resistive DAC 106.

Figure 7A:
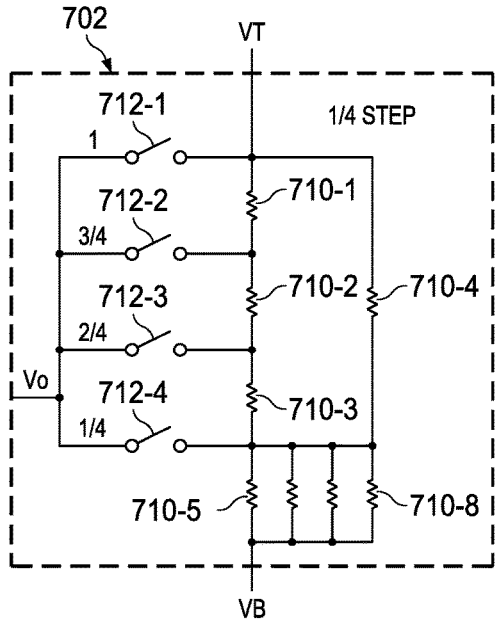
FIGS. 7A-7C show schematics of calibration circuitry suitable for use in a fine DAC in accordance with various examples.
Figure 7B:
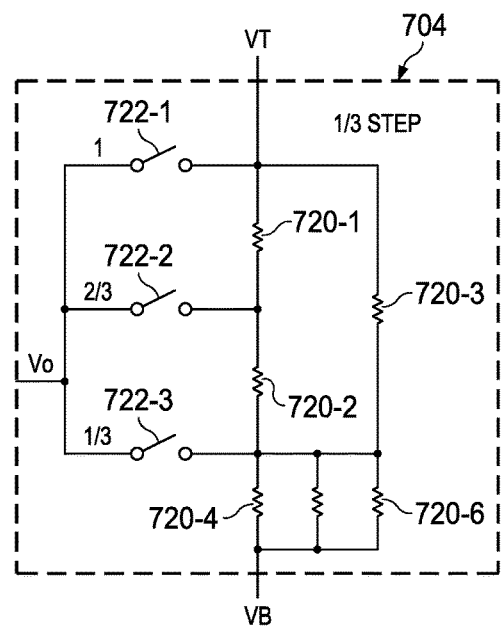
Figure 7C:
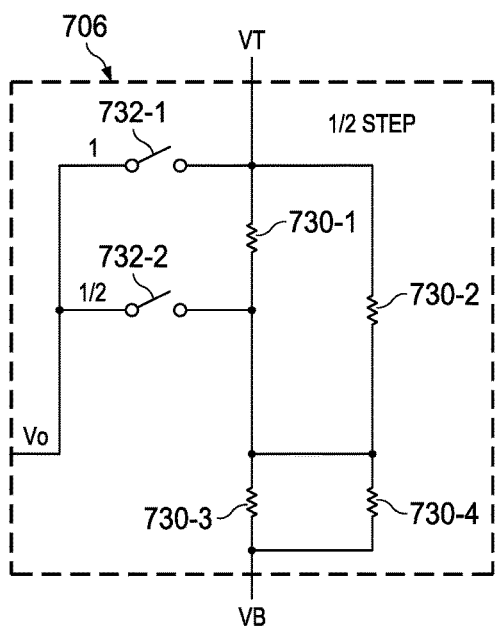

Some embodiments of the fine resistive DAC 108 (or other fine resistive DACs disclosed herein) may include calibration circuitry to compensate for uncertainty in the value of the unit resistors 202 or other variations in the circuitry of the fine DAC 108 that affect the output voltage produced by the fine DAC. FIGS. 7A-7C show schematics of calibration circuitry suitable for use in the fine DAC 108 in accordance with various examples. The calibration circuitry is generally similar to the circuitry of the fine DAC itself. FIG. 7A shows a one-quarter step calibration unit 702 that includes eight unit resistors and four switches. The calibration unit 702 includes a first plurality of unit resistors (710-1, 710-2, 710-3) connected in series, and single unit resistor 710-4 connected in parallel with the first plurality of unit resistors 710. Unit resistor 710-1 is connected to a top voltage source. A second plurality of unit resistors (710-5 to 710-8) are connected in parallel with one another, and connected in series with the combined resistance formed by unit resistors 710-1 to 710-4. The second plurality of unit resistors 710 are connected to a bottom voltage source. The calibration unit 702 also includes a plurality of switches (712-1 to 712-4). Each of the switches 712-2 to 712-4 is connected to a junction of two of the unit resistors 710. The switch 712-1 is connected to the top voltage source.

FIG. 7B shows a one-third step calibration unit 704 that includes six unit resistors and three switches. The calibration unit 704 includes a first plurality of unit resistors (720-1, 720-2) connected in series, and single unit resistor 720-3 connected in parallel with the first plurality of unit resistors 710. Unit resistor 720-1 is connected to a top voltage source. A second plurality of unit resistors (720-4 to 720-6) are connected in parallel with one another, and connected in series with the combined resistance formed by unit resistors 720-1 to 720-3. The second plurality of unit resistors 720 are connected to a bottom voltage source. The calibration unit 704 also includes a plurality of switches (722-1 to 712-3). Each of the switches 722-2 and 722-3 is connected to a junction of two of the unit resistors 720. The switch 722-1 is connected to the top voltage source.

FIG. 7C shows a one-half step calibration unit 706 that includes four unit resistors and two switches. The calibration unit 706 includes a first plurality of unit resistors, 730-1 and 730-2, connected in series parallel. Unit resistor 730-1 is connected to a top voltage source. A second plurality of unit resistors, 720-3 and 730-4, are connected in parallel with one another, and connected in series with the combined resistance formed by unit resistors 730-1 and 730-2. The second plurality of unit resistors 720 are connected to a bottom voltage source. The calibration unit 706 also includes a plurality of switches, 732-1 and 732-2). The switch 732-2 is connected to the junction of two of the unit resistors 730-1 and 730-3. The switch 732-1 is connected to the top voltage source.

Other embodiments of the calibration unit may include a one-eighth step calibration unit that includes sixteen unit resistors and eight switches, a one-fifth step calibration unit that includes ten unit resistors and five switches, a one-seventh step calibration unit that includes fourteen unit resistors and seven switches, a one-sixth step calibration unit that includes twelve unit resistors and six switches, a one-fifth step calibration unit that includes ten unit resistors and five switches, etc. The switches of a calibration unit may be selected in accordance with a calibration process executed by the successive approximation circuitry 114 as part of initialization of the ADC 100.

Figure 8:
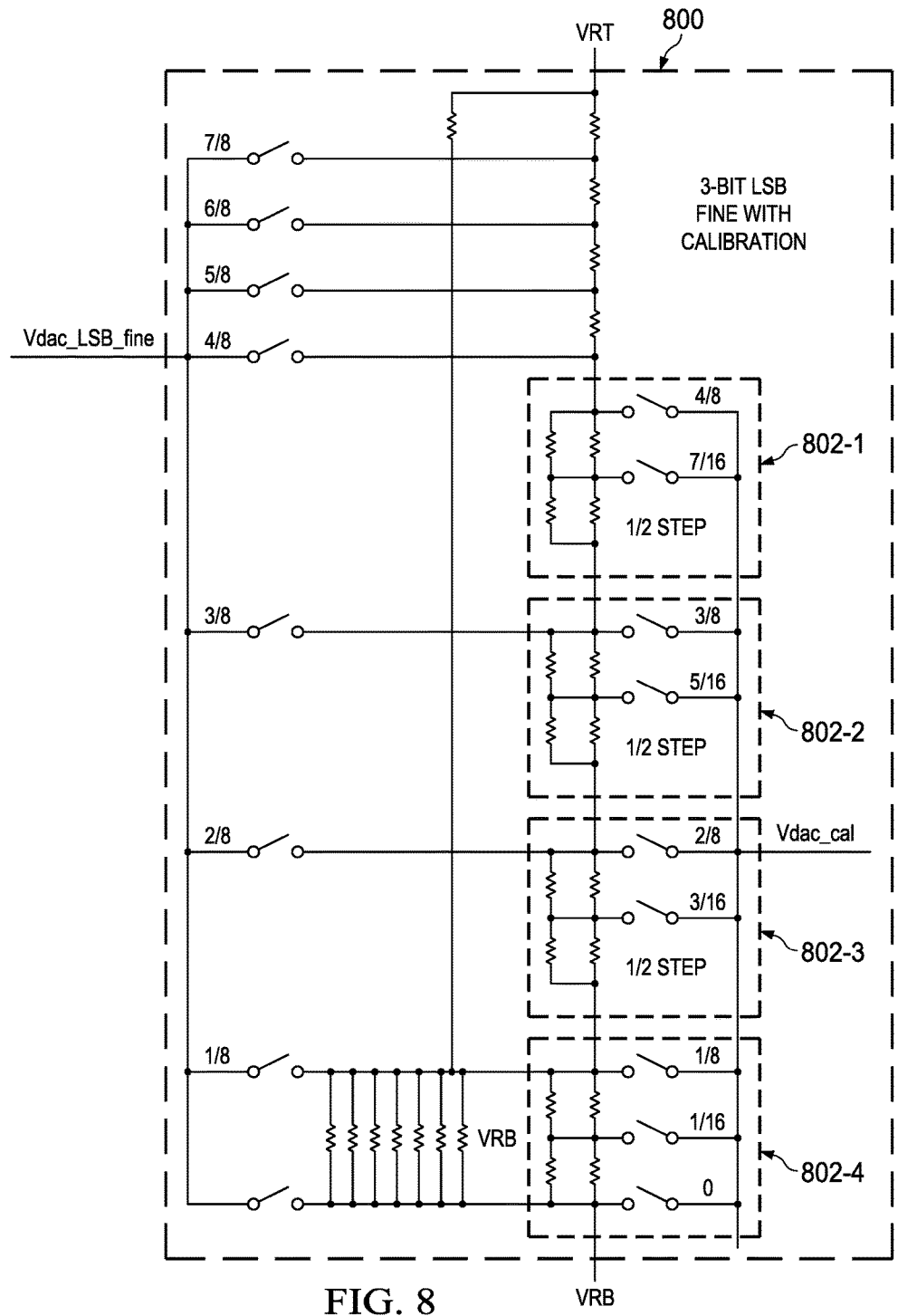
FIG. 8 shows a fine DAC that includes calibration circuitry in accordance with various examples.

The calibration units may be applied in a variety of ways to implement calibration of the fine DAC 108. For example, the unit resistors 202-1G and/or 202-1K and/or other unit resistors 202 of the fine DAC 108 or the coarse DAC 106 shown in FIG. 2 may be replaced by a calibration unit 702 to provide a calibration step of ¼ LSB and a calibration range of +/−2 LSB. Thus, embodiments can provide calibration without inclusion of a calibration DAC as in conventional implementations. FIG. 8 shows an embodiment of a fine resistive DAC 800 that includes calibration circuitry in accordance with various examples. The fine resistive DAC 800 is a three bit DAC that is generally similar to the fine resistive DAC 108, but with calibration units in place of some of the series unit resistors 202. In the fine resistive DAC 800, the calibration units 802-1, 802-2, 802, 3, and 802-4 replace four of the series connected unit resistors 202. The calibration units 802 are one-half step calibration units similar to calibration unit 706. An output of the calibration units, VDAC_CAL, may be provided to a capacitor of the capacitive DAC to adjust the DAC output voltage.

Figure 9:
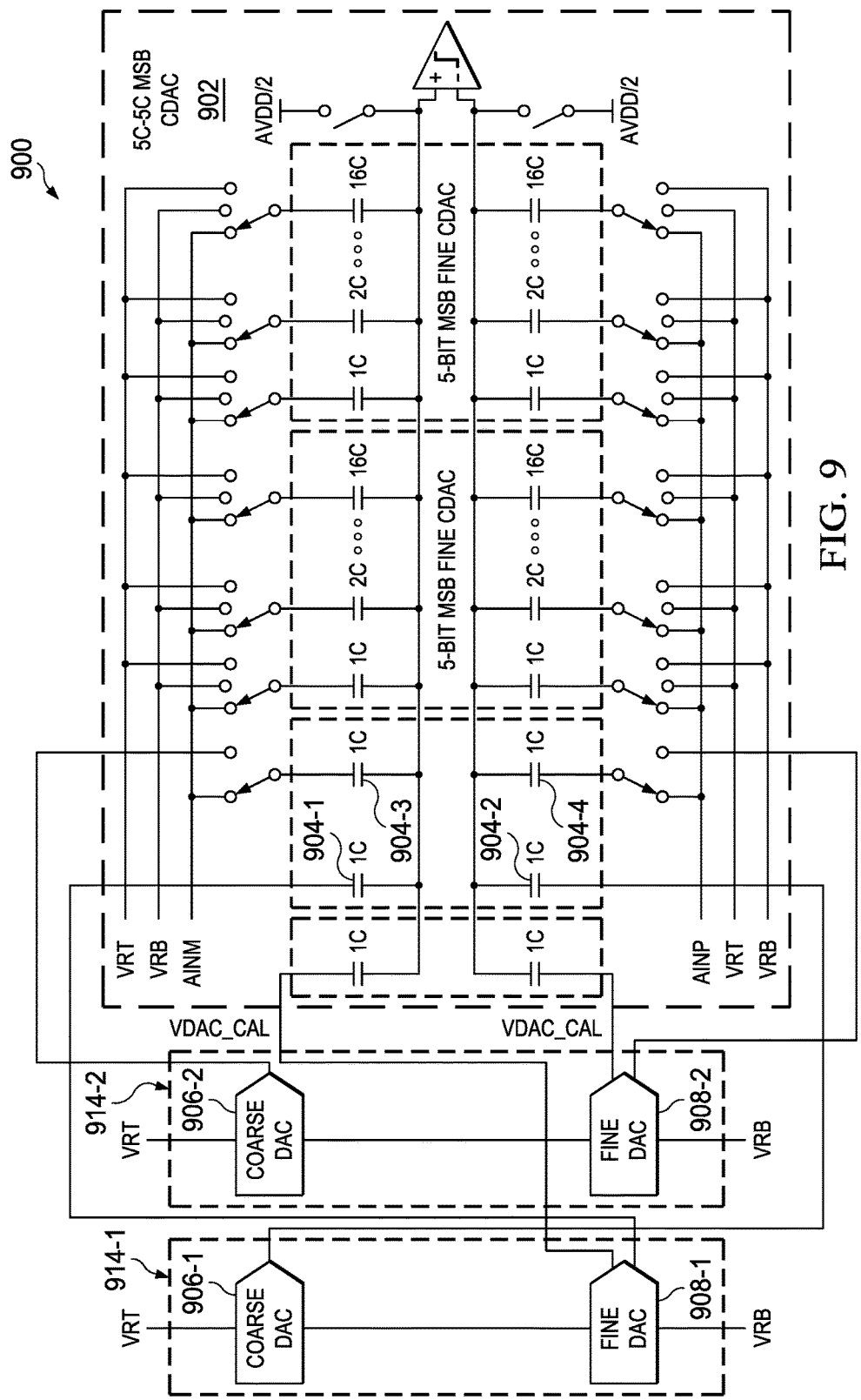
FIG. 9 shows a schematic diagram of a differential DAC suitable for use in a differential successive approximation ADC in accordance with various examples.
Figure 10:
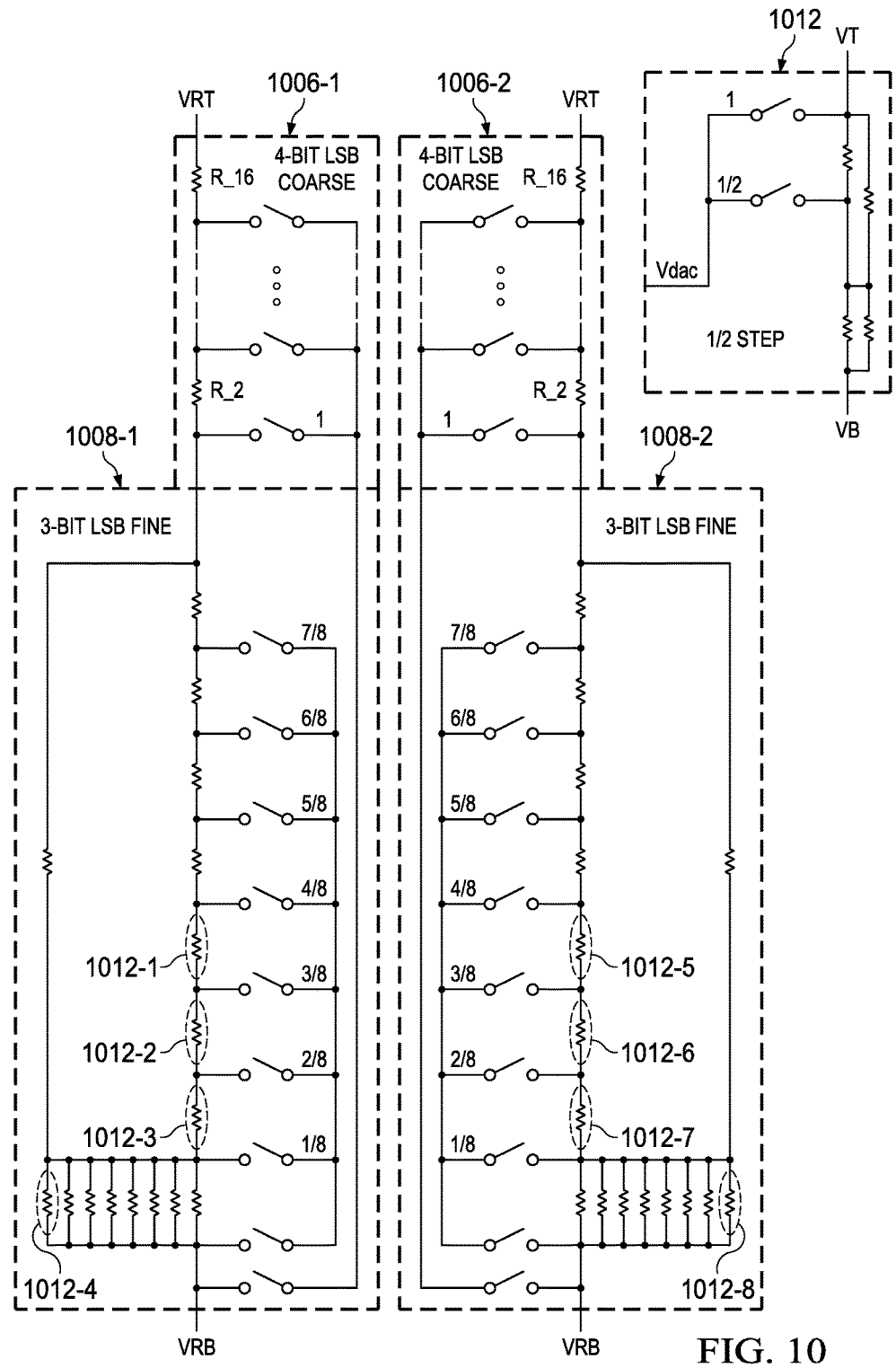

FIG. 9 shows a schematic diagram of a differential DAC 900 suitable for use in a successive approximation differential ADC in accordance with various examples. The differential DAC 900 is a sixteen bit DAC. The differential DAC 900 include a coarse capacitive DAC 910, a fine capacitive DAC 912, a first resistive DAC 914-1 including coarse resistive DAC 906-1 and fine resistive DAC 908-1, and a second resistive DAC 914-2 including coarse resistive DAC 906-2 and fine resistive DAC 908-2. The capacitive DACs 910, 912 are five bit DACs, and the resistive DACs 914 are seven bit DACs. The coarse resistive DAC 906 may be similar to the coarse resistive DAC 106. The fine resistive DACs 908 may be similar to the fine resistive DAC 800 or 108. The coarse resistive DACs 906-1 and 906-2 are respectively coupled to capacitors 904-4 and 904-3 of the capacitive DAC 902. The fine resistive DACs 908-1 and 908-2 are respectively coupled to capacitors 904-1 and 904-2 of the capacitive DAC 902. A calibration voltage output of each of the fine resistive DACs 908-1, 908-2 is connected to a capacitor coupled to the capacitive DACs 912, 910.

Using the fine resistive DAC 800 to implement the DACs 908, the differential DAC 900 can be utilized in a full differential successive approximation ADC with two calibration bits, a calibration step of ¼ LSB, and a calibration range of LSB. The calibration can be implemented with an increase of twenty-four unit resistors over the fine resistive DAC 108 by replacing eight unit resistors with the calibration units 706. In comparison to a conventional sixteen bit ADC with ¼ LSB calibration step and +/−4 LSB range, the DAC 900 may be implemented with 66 fewer unit resistors and 208 fewer switches in the resistive DAC, and with 24 unit resistors and 16 switches in place of an additional resistive calibration DAC and additional 32 switches. Thus, embodiments of the DAC 900 may be substantially more efficient than the equivalent conventional implementation in terms of circuit area without loss of performance.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog to digital converter (ADC), comprising:
   successive approximation circuitry configured to perform a binary search for a digital value best representing an analog input signal;
   a digital to analog converter (DAC) coupled to the successive approximation logic, the DAC is configured to convert an M bit digital value to an analog signal, the DAC comprising:
   a capacitive DAC configured to convert N most significant bits of the digital value to an analog signal; and
   a first instance of a resistive DAC configured to covert M-N least significant bits (LSBs) of the digital value to an analog signal, the resistive DAC comprising:
   a coarse DAC configured to convert a most significant R bits of the M-N least significant bits to an analog signal; and
   a fine DAC configured to convert M-N-R least significant bits of the M-N least significant bits to an analog signal.

2. The ADC of claim 1, wherein an output of the coarse DAC is switchably coupled to a first capacitor of the capacitive DAC, and an output of the fine DAC is switchably coupled to a second capacitor of the capacitive DAC.

3. The ADC of claim 1, wherein the coarse DAC comprises $2^R-1$ sequentially connected unit resistors and $2^R$ switches, each of the switches connected to a different voltage in the coarse DAC.

4. The ADC of claim 3, wherein a first end of the sequentially connected unit resistors is connected to a top reference voltage, and a second end of the sequentially connected unit resistors is connected to the fine DAC.

5. The ADC of claim 1, wherein the fine DAC comprises $2^{(M-N-R)}$ sequentially connected unit resistors and $2^{(M-N-R)}$ switches, each of the switches is connected to a terminal of one of the unit resistors.

6. The ADC of claim 5, wherein a first end of the sequentially connected unit resistors is connected to the coarse DAC, and a second end of the sequentially connected unit resistors is connected to a bottom reference voltage.

7. The ADC of claim 6, wherein the fine DAC comprises $2^{(M-N-R)}-1$ unit resistors connected in parallel with a one of the sequentially connected unit resistors that is connected to the bottom reference voltage.

8. The ADC of claim 7, wherein the fine DAC comprises a given unit resistor connected in parallel with $2^{(M-N-R)}-1$ of the sequentially connected unit resistors that are not connected to the bottom reference voltage, wherein a first terminal of the given unit resistor is connected to the coarse DAC and a second terminal of the given unit resistor is connected to a common terminal of the $2^{(M-N-R)}-1$ unit resistors connected in parallel.

9. The ADC of claim 7, wherein the fine DAC comprises a calibration circuit that replaces at least one of the sequentially connected unit resistors or at least one of the unit resistors connected in parallel, the calibration circuit comprising:

$2^x$ unit resistors connected in series;
$2^x$ switches, one of the switches corresponding to each of the $2^x$ unit resistors;
$2^x-1$ unit resistors connected in parallel with one of the $2^x$ unit resistors connected in series; and
an additional unit resistor connected in parallel across $2^x-1$ of the unit resistors connected in series.

10. The ADC of claim 1, wherein the coarse DAC comprises:
$2^R$ sequentially connected unit resistors arranged as an array of R unit resistors per row and R unit resistors per column;
$2^R$ switches, one of the switches corresponding to each of the sequentially connected unit resistors;
a row decoder connected to the $2^R$ switches and configured to select a row of the array based on bits of the digital value;
R column switches, each of the column switches corresponding to a column of the array; and
a column selector coupled to the R column switches and configured to select a column of the array base on bits of the digital value;
wherein the fine DAC serves as one of the $2^R$ sequentially connected unit resistors.

11. The ADC of claim 1, further comprising
a second instance of the resistive DAC;
wherein for the first instance of the resistive DAC:
an output of the coarse DAC is switchably coupled to a first capacitor of the capacitive DAC, and an output of the fine DAC is switchably coupled to a second capacitor of the capacitive DAC;
wherein for the second instance of the resistive DAC:
an output of the coarse DAC is switchably coupled to a third capacitor of the capacitive DAC, and an output of the fine DAC is switchably coupled to a fourth capacitor of the capacitive DAC.

12. A digital-to-analog converter (DAC) for converting an M bit digital value to an analog signal, the DAC comprising:
a capacitive DAC configured to convert N most significant bits of the digital value to an analog signal; and
a first instance of a resistive DAC configured to covert M-N least significant bits (LSBs) of the digital value to an analog signal, the resistive DAC comprising:
a coarse DAC configured to convert a most significant R bits of the M-N least significant bits to an analog signal, wherein an output of the coarse DAC is switchably coupled to a first capacitor of the capacitive DAC; and
a fine DAC configured to convert M-N-R least significant bits of the M-N least significant bits to an analog signal, wherein an output of the fine DAC is switchably coupled to a second capacitor of the capacitive DAC.

13. The DAC of claim 12, wherein:
the coarse DAC comprises $2^R-1$ sequentially connected unit resistors and $2^R$ switches, and each of the switches is connected to a different voltage of the coarse DAC; and
a first end of the sequentially connected unit resistors is connected to a top reference voltage, and a second end of the sequentially connected unit resistors is connected to the fine DAC.

14. The DAC of claim 12, wherein:
the fine DAC comprises $2^{(M-N-R)}$ sequentially connected unit resistors and $2^{(M-N-R)}$ switches, and each of the switches is connected to a terminal of one of the unit resistors;

a first end of the sequentially connected unit resistors is connected to the coarse DAC; and
a second end of the sequentially connected unit resistors is connected to a bottom reference voltage.

15. The DAC of claim 14, wherein the fine DAC comprises $2^{(M-N-R)}-1$ unit resistors connected in parallel with a one of the sequentially connected unit resistors that is connected to the bottom reference voltage.

16. The DAC of claim 15, wherein the fine DAC comprises a given unit resistor connected in parallel with $2^{(M-N-R)}-1$ of the sequentially connected unit resistors that are not connected to the bottom reference voltage, wherein a first terminal of the given unit resistor is connected to the coarse DAC and a second terminal of the given unit resistor is connected to a common terminal of the unit resistors connected in parallel.

17. The DAC of claim 15, wherein the fine DAC comprises a calibration circuit that replaces at least one of the sequentially connected unit resistors or at least one of the unit resistors connected in parallel, the calibration circuit comprising:
$2^x$ unit resistors connected in series;
$2^x$ switches, one of the switches corresponding to each of the $2^x$ unit resistors;
$2^x-1$ unit resistors connected in parallel with one of the $2^x$ unit resistors connected in series;
an additional unit resistor connected in parallel across $2^x-1$ of the unit resistors connected in series; and
X is greater than zero.

18. The DAC of claim 12, wherein the coarse DAC comprises:
$2^R$ sequentially connected unit resistors arranged as an array of R unit resistors per row and R unit resistors per column;
$2^R$ switches, one of the switches corresponding to each of the sequentially connected unit resistors;
a row decoder connected to the $2^R$ switches and configured to select a row of the array based on bits of the digital value;
R column switches, each of the column switches corresponding to a column of the array; and
a column selector coupled to the R column switches and configured to select a column of the array base on bits of the digital value;
wherein the fine DAC serves as one of the $2^R$ sequentially connected unit resistors.

19. The DAC of claim 12, further comprising a second instance of the resistive DAC; wherein for the second instance of the resistive DAC: an output of the coarse DAC of the second instance of the resistive DAC is switchably coupled to a third capacitor of the capacitive DAC, and an output of the fine DAC of the second instance of the resistive DAC is switchably coupled to a fourth capacitor of the capacitive DAC.

20. A digital-to-analog converter (DAC) for converting an M bit digital value to an analog signal, the DAC comprising:
a capacitive DAC configured to convert N most significant bits of the digital value to an analog signal; and
a resistive DAC configured to covert M-N least significant bits (LSBs) of the digital value to an analog signal, the resistive DAC comprising:
a coarse DAC configured to convert a most significant R bits of the M-N least significant bits to an analog signal, wherein the coarse DAC comprises $2^R-1$ sequentially connected unit resistors and $2^R$ switches, each of the switches connected to a different voltage of the coarse DAC, and wherein an output of the coarse DAC is switchably coupled to a first capacitor of the capacitive DAC; and a fine DAC configured to convert M-N-R least significant bits of the M-N least significant bits to an analog signal, the fine DAC comprising $2^{(M-N-R)}$ sequentially connected unit resistors and $2^{(M-N-R)}$ switches, each of the switches connected to a terminal of one of the unit resistors, wherein an output of the fine DAC is switchably coupled to a second capacitor of the capacitive DAC and resistance of the fine DAC is equivalent to a unit resistor.

* * * * *